(12) United States Patent
Wang

(10) Patent No.: US 11,955,483 B2
(45) Date of Patent: Apr. 9, 2024

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 134 days.

(21) Appl. No.: 17/234,061

(22) Filed: Apr. 19, 2021

(65) Prior Publication Data

US 2021/0398974 A1    Dec. 23, 2021

(30) Foreign Application Priority Data

Jun. 19, 2020 (CN) .......................... 202010567168.6

(51) Int. Cl.
*H01L 27/088* (2006.01)
*H01L 21/8234* (2006.01)
*H01L 29/423* (2006.01)

(52) U.S. Cl.
CPC .. *H01L 27/0886* (2013.01); *H01L 21/823431* (2013.01); *H01L 21/823437* (2013.01); *H01L 29/42376* (2013.01)

(58) Field of Classification Search
CPC ..... H01L 21/823481; H01L 21/823878; H01L 27/0886; H01L 21/823431; H01L 29/785; H01L 29/66795
See application file for complete search history.

(56) References Cited

U.S. PATENT DOCUMENTS

| | | | |
|---|---|---|---|
| 9,293,459 B1* | 3/2016 | Cheng | H01L 21/76224 |
| 10,366,930 B1* | 7/2019 | Xie | H01L 21/823437 |
| 2016/0379893 A1* | 12/2016 | Ok | H01L 27/0924 257/369 |
| 2019/0067120 A1* | 2/2019 | Ching | H01L 27/0924 |
| 2020/0058649 A1* | 2/2020 | Ching | H01L 27/0886 |
| 2021/0242206 A1* | 8/2021 | Lin | H01L 27/0886 |

* cited by examiner

*Primary Examiner* — Tuan A Hoang
(74) *Attorney, Agent, or Firm* — Anova Law Group, PLLC

(57) ABSTRACT

A semiconductor device and a fabrication method are provided. The semiconductor device includes: a base substrate; a gate structure on the base substrate including a first portion in a first region and a second portion in a second region; and a separation section in the first portion of the gate structure in the first region. A length of the first portion of the gate structure in the first region is larger than a length of the second portion of the gate structure in the second region. A top surface of the separation section is higher than a top surface of the gate structure.

15 Claims, 11 Drawing Sheets

SEMICONDUCTOR DEVICE AND FABRICATION METHOD THEREOF

CROSS-REFERENCE TO RELATED APPLICATION

This application claims the priority of Chinese Patent Application No. 202010567168.6, filed on Jun. 19, 2020, the content of which is incorporated herein by reference in its entirety.

TECHNICAL FIELD

The present disclosure generally relates to the field of semiconductor technology and, more particularly, relates to a semiconductor device and its fabrication method.

BACKGROUND

As the electronic industry constantly develops towards smaller and faster electronic devices, smaller and faster electronic devices can simultaneously support a larger number of more and more complex cutting-edge functions. Therefore, the continuing trend in the semiconductor industry is to manufacture low-cost, high-performance, and low-power integrated circuits (ICs). These goals have been achieved to a large extent by scaling down the size of semiconductor ICs (for example, minimizing characteristic dimensions (CD)) to improve production efficiency and reduce related costs. However, this scaling down also increases the complexity of the semiconductor manufacturing process. Therefore, the continuous development of semiconductor ICs and devices requires simultaneous progress in semiconductor manufacturing processes and technologies.

A gate structure is a part of a device, and its material greatly affects the performance of the device. A traditional polysilicon gate process has a "polysilicon depletion" effect that affects device conduction, so a metal gate is introduced. After the metal gate is introduced, an interconnection metal layer needs to be formed on the metal gate to form an electrical connection with the outside world.

However, a short circuit is easy to happen between an interconnection metal layer and a metal gate, and the quality of the formed semiconductor device in the existing technologies needs to be further improved.

SUMMARY

One aspect of the present disclosure provides a semiconductor device. The semiconductor device includes: a base substrate; a gate structure on the base substrate including a first portion in a first region and a second portion in a second region; and a separation section in the first portion of the gate structure in the first region. A length of the first portion of the gate structure in the first region is larger than a length of the portion of the gate structure in the second region. A top surface of the separation section is higher than a top surface of the gate structure.

Optionally, the top surface of the separation section is higher than the top surface of the gate structure by about 10 nm to about 50 nm.

Optionally, the separation section is made of a material including $SiN_x$, $SiO_2$, SiON, or a combination thereof.

Optionally, the base substrate includes a substrate and a plurality of fins on the substrate wherein the plurality of fins includes a sparse region and a dense region. The length of a portion of the gate structure is a distance of the portion of the gate structure across corresponding adjacent fins of the plurality of fins along a direction perpendicular to an extending direction of the plurality of fins.

Optionally, the gate structure is disposed on the substrate and crosses the plurality of fins. The first portion of the gate structure in the first region is located between the plurality of fins in the sparse region, and the second portion of the gate structure in the second region is located between the plurality of fins in the dense region.

Optionally, the semiconductor device further includes an isolation layer on the substrate. The isolation layer covers a portion of sidewalls of the plurality of fins.

Optionally, the semiconductor device further includes a dielectric layer on the top surface of the gate structure, on sidewalls of the separation section that are higher than the gate structure, and on the top surface of the separation section.

Optionally, the semiconductor device further includes a hard mask layer on the top surface of the gate structure. The dielectric layer is located on the top surface of the hard mask layer, on the sidewalls of the separation section that are higher than the hard mask layer, and on the top surface of the separation section.

Optionally, the semiconductor device further includes a metal layer in the dielectric layer. A bottom surface of the metal layer is in contact with the top surface of the gate structure at a side of the separation section.

Another aspect of the present disclosure provides a fabrication method for forming a semiconductor structure. The method includes: providing a base substrate; forming a gate structure on the base substrate including a first portion in a first region and a second portion in a second region; forming a sacrificial layer on the gate structure; etching the sacrificial layer and the first portion of the gate structure in the first region under then sacrificial layer until exposing a surface of the base substrate, thereby forming a first opening in the first portion of the gate structure in the first region and in the sacrificial layer; forming a separation section in the first opening to fill up the first opening; and removing the sacrificial layer. A length of the first portion of the gate structure in the first region is larger than a length of the portion of the gate structure in the second region Optionally, the sacrificial layer is made of a material including amorphous silicon, amorphous carbon, amorphous germanium, or a combination thereof.

Optionally, a thickness of the sacrificial layer may be about 10 nm to about 50 nm.

Optionally, the separation section is formed by an atomic layer deposition process or a chemical vapor deposition process.

Optionally, the separation section is made of a material including $SiN_x$, $SiO_2$, SiNO, or a combination thereof.

Optionally, the base substrate includes a substrate and a plurality of fins is formed on the substrate. The plurality of fins includes a sparse region and a dense region. The length of a portion of the gate structure is a distance of the portion of the gate structure across corresponding adjacent fins of the plurality of fins along a direction perpendicular to an extending direction of the plurality of fins.

Optionally, the gate structure is disposed on the substrate and crosses the plurality of fins. The gate structure in the first region is located between the plurality of fins in the sparse region, and the gate structure in the second region is located between the plurality of fins in the dense region.

Optionally, after forming the plurality of fins and before forming the gate structure, the method further includes forming an isolation layer on the substrate to cover a portion of sidewalls of the plurality of fins.

Optionally, after removing the sacrificial layer, the method further includes: forming a dielectric layer on the top surface of the gate structure, on a portion of sidewalls of the separation section, and on the top surface of the separation section.

Optionally, after forming the dielectric layer, the method further includes: Etching the dielectric layer to form a second opening in the dielectric layer, wherein a bottom of the second opening exposes a sidewall surface of a side of the separation section, a portion of the top surface of the separation section, and a portion of the top surface of the gate structure at the sidewall surface of the one side of the separation section.

Optionally, after forming the second opening, the method further includes: forming a metal layer to fill up the second opening.

In the present disclosure, a sacrificial layer may be formed on the gate structure before forming a first opening. The sacrificial layer and the gate structure under the sacrificial layer may be etched to form the first opening in the first portion of the gate structure in the first region. A separation section may be formed in the first opening and then the sacrificial layer may be removed. A top surface of the separation section may be higher than a top surface of the gate structure. When subsequently forming a metal layer on a portion of the gate structure at a side of the separation section, a distance between the metal layer and another portion of the gate structure at another side of the separation section may be increased. The possibility that a short circuit happens between the metal layer and the portion of the gate structure at another side of the separation section may be reduced. The stability of the performance of the semiconductor device, and the performance of the semiconductor device may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-7 illustrate semiconductor structures corresponding to certain stages for forming a semiconductor structure.

Figure 1:
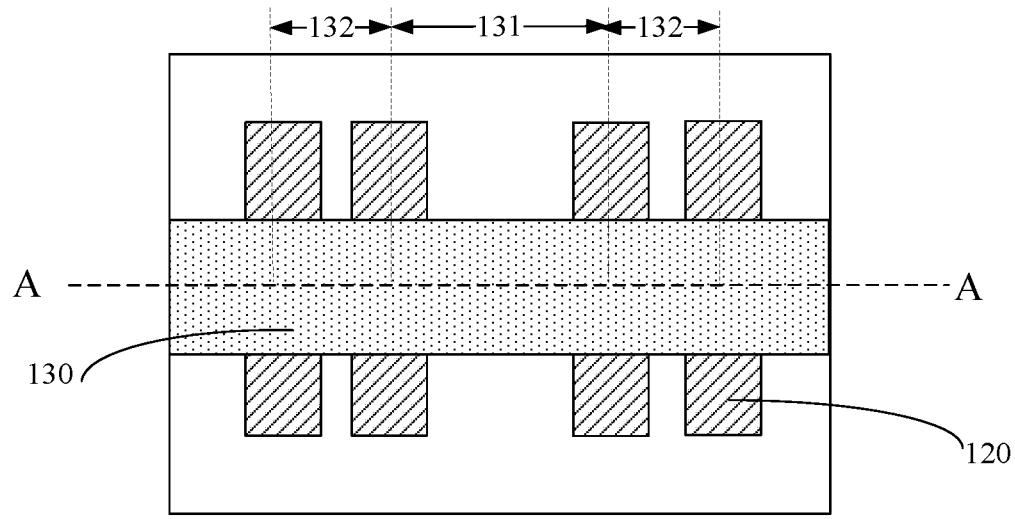
FIGS. 1-7 illustrate semiconductor structures corresponding to certain stages for forming a semiconductor structure.
Figure 2:
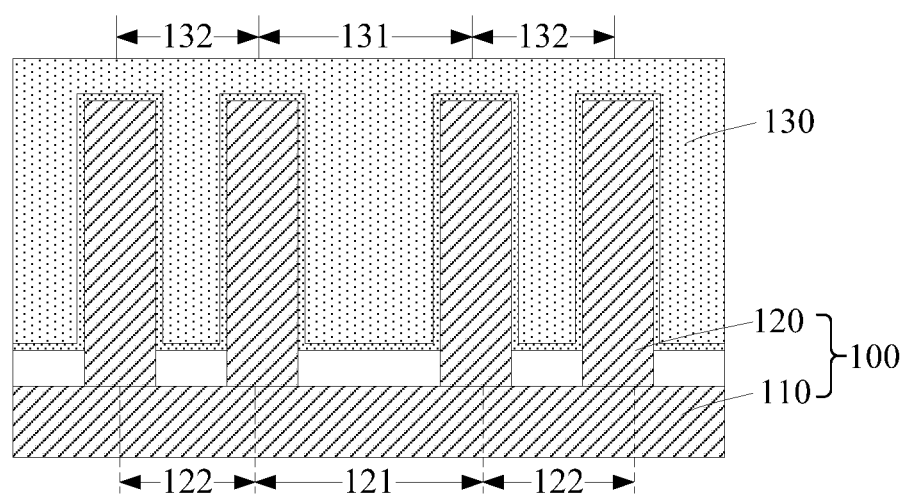

FIG. 1 is a top view of FIG. 2 and FIG. 2 is a cross-sectional view along an A-A line in FIG. 1.

As illustrated in FIGS. 1-2, a base substrate 100 is provided. A gate structure 130 is formed on the base substrate 100. The gate structure 130 includes a first portion in a first region 131 and a second portion in a second region 132. A length of the first portion of the gate structure in the first region 131 is larger than a length of the second portion of the gate structure in the second region 132.

The base substrate 100 includes a substrate 110 and a plurality of fins 120 discrete from each other on the substrate 110. The plurality of fins 120 includes a sparse region 121 and a dense region 122.

The gate structure 130 crosses the plurality of fins 120. The gate structure in the first region 131 is disposed between the plurality of fins in the sparse region 121, and the gate structure in the second region is disposed between the plurality of fins in the dense region 122.

Figure 3:
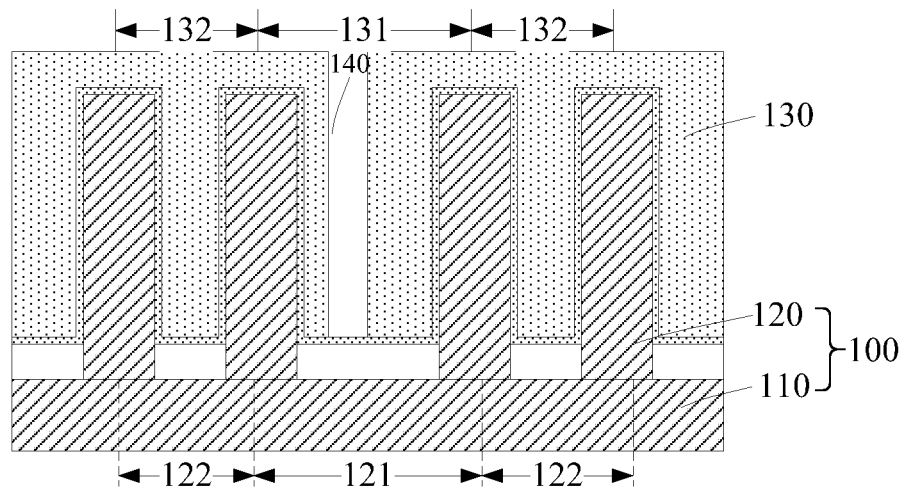

As illustrated in FIG. 3, a first opening is formed in the first portion of the gate structure 130 in the first region 131. The first opening 140 penetrates through the gate structure 130 along a normal direction of the substrate and a bottom of the first opening 140 exposes a surface of the substrate 110.

The first opening 140 is disposed between adjacent fins of the plurality of fins 120 in the sparse region 121.

Figure 4:
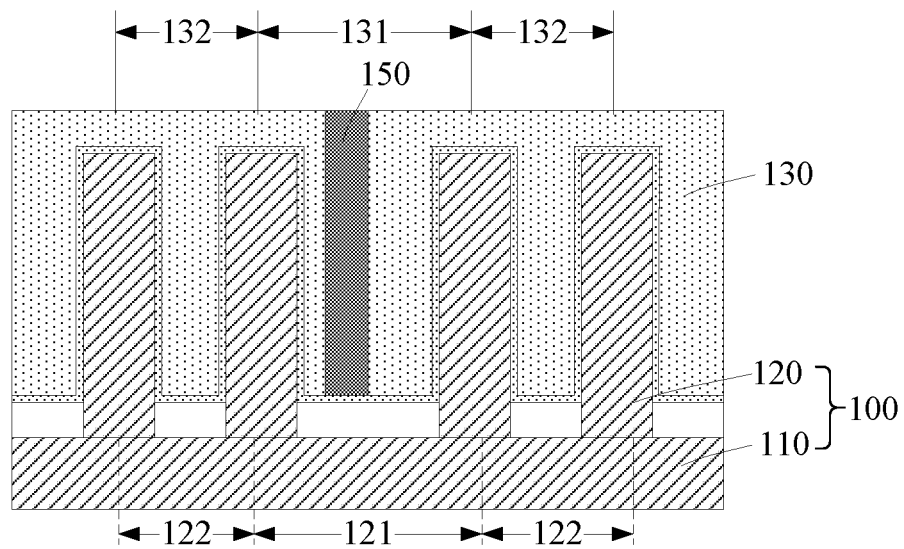

As illustrated in FIG. 4, the first opening 140 is filled with a material of a separation layer, and the separation layer is planarized to form a separation section 150. A top surface of the separation section 150 is flush with a top surface of the gate structure 130.

Figure 5:
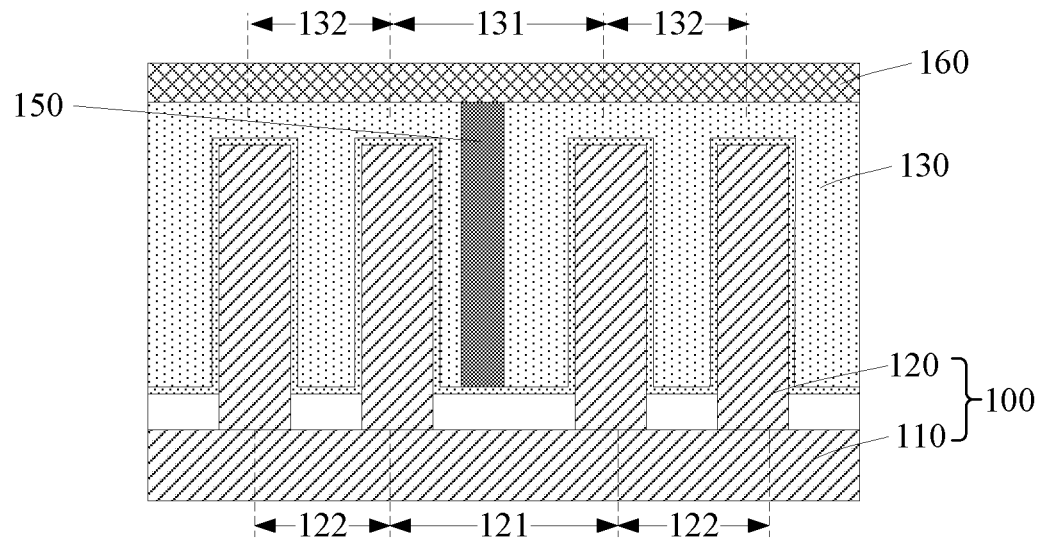

As illustrated in FIG. 5, a dielectric layer 160 is formed on the gate structure 130 and the separation section 150.

Figure 6:
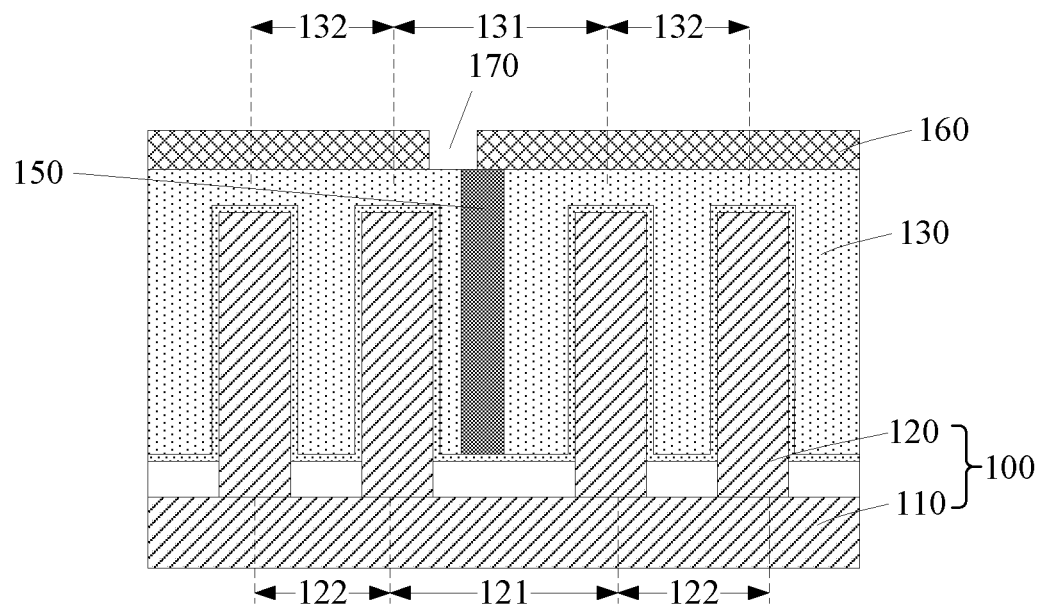

As illustrated in FIG. 6, the dielectric layer 160 is etched until exposing the top surface of a portion of the gate structure at a side of the separation section 150, to form a second opening 170 in the dielectric layer 160. A bottom of the second opening 170 exposes a portion of the top surface of the separation section 150.

Figure 7:
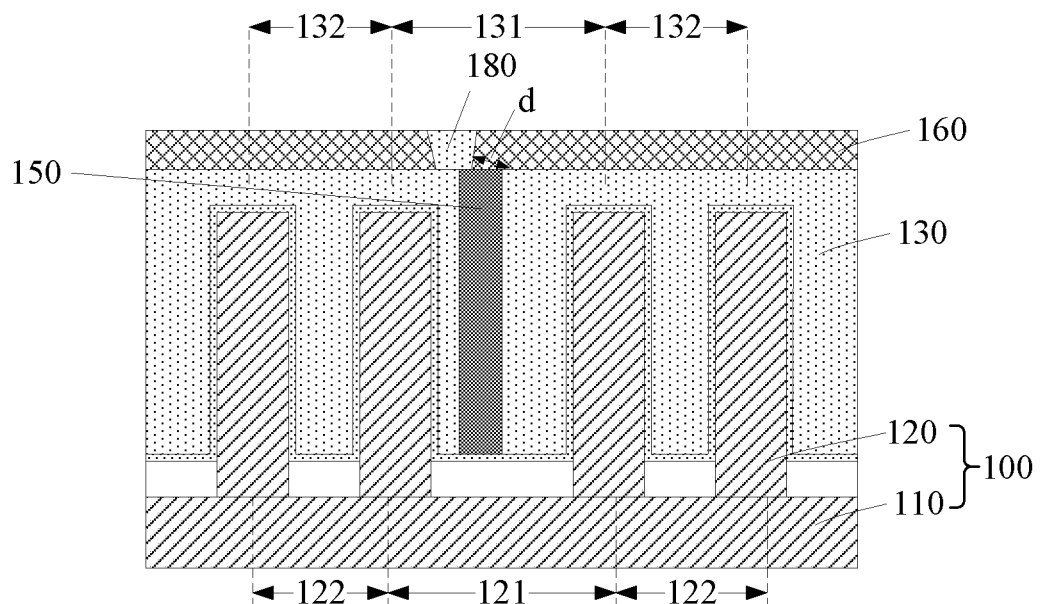

As illustrated in FIG. 7, a metal layer 180 is formed in the second opening 170. The metal layer 180 is used as an interconnection layer for electrical connection with the outside world subsequently.

In the formed semiconductor device, a distance d between the metal layer 180 and a portion of the gate structure 130 at another side of the separation section 150 is too small, and a short circuit is easy to happen between the metal layer 180 at a side of the separation section 150 and the portion of the gate structure 130 at another side of the separation section 150. The performance of the semiconductor is poor and the application of the semiconductor device is limited.

The present disclosure provides a semiconductor device and its fabrication method. In the present disclosure, a sacrificial layer may be formed on the gate structure before forming a first opening. The sacrificial layer and the gate structure under the sacrificial layer may be etched to form the first opening in the first portion of the gate structure in a first region. A separation section may be formed in the first opening and then the sacrificial layer may be removed. A top surface of the separation section may be higher than a top surface of the gate structure. When subsequently forming a metal layer on a portion of the gate structure at a side of the separation section, a distance between the metal layer and another portion of the gate structure at another side of the separation section may be increased. Possibility that a short circuit happens between the metal layer and the portion of the gate structure at another side of the separation section may be reduced. The stability of the performance of the semiconductor device, and the performance of the semiconductor device may be improved.

One embodiment of the present disclosure provides a fabrication method of a semiconductor device, as illustrated in FIGS. 8-18.

Figure 8:
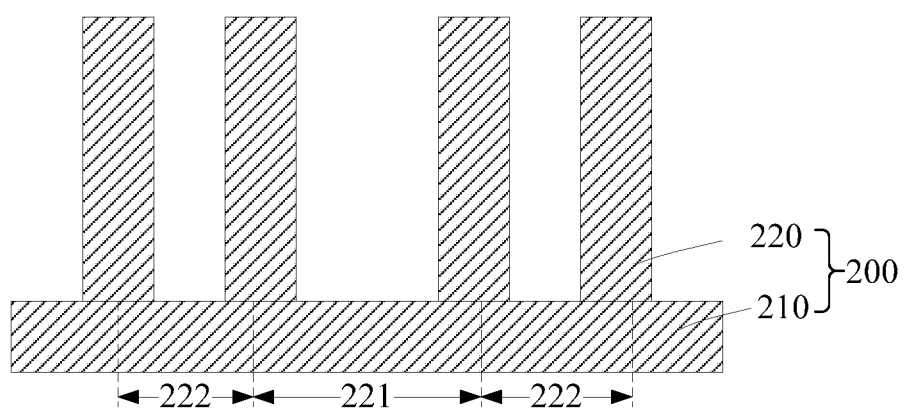
FIGS. 8-18 illustrate semiconductor structures corresponding to certain stages of forming an exemplary semiconductor structure according to various disclosed embodiments of the present disclosure.
Figure 20:
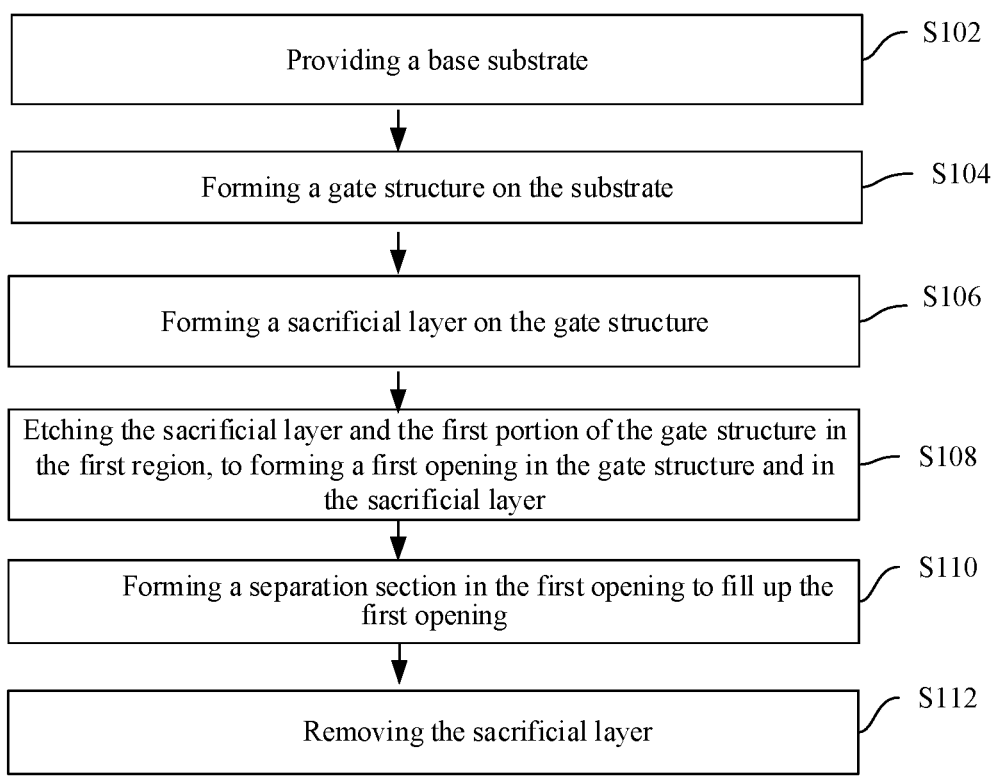
FIG. 20 illustrates an exemplary method for forming a semiconductor device according to various disclosed embodiments of the present disclosure.

As illustrated in FIG. 8, a base substrate 200 may be provided (e.g., S102 in FIG. 20).

In one embodiment, the base substrate 200 may include a substrate 210 and a plurality of fins 220 discrete from each other on the substrate 210.

In one embodiment, the substrate 210 may be made of single-crystalline silicon. In some other embodiments, the substrate 210 may be made of polycrystalline silicon or amorphous silicon. In some other embodiments, the substrate 210 may be made of a semiconductor material including germanium, SiGe, or GaAs.

In one embodiment, the substrate 210 and the plurality of fins 220 may be formed by: providing an initial substrate (now shown); forming a pattern layer on the initial substrate, and etching the initial substrate using the pattern layer as a mask, to form the substrate 210 and the plurality of fins 220.

In one embodiment, the plurality of fins 220 may be made of single-crystalline silicon. In other embodiments, the plurality of fins 220 may be made of a semiconductor material including single-crystalline SiGe.

In some other embodiments, the base substrate 200 may be a structure without fins.

In one embodiment, the base substrate 200 may include the plurality of fins 220. Distances between adjacent fins of the plurality of fins 220 may be different. A region where the distances between adjacent fins is larger may be defined as a sparse region 221, and another region where the distances between adjacent fins is smaller may be defined as a dense region 222.

Figure 9:
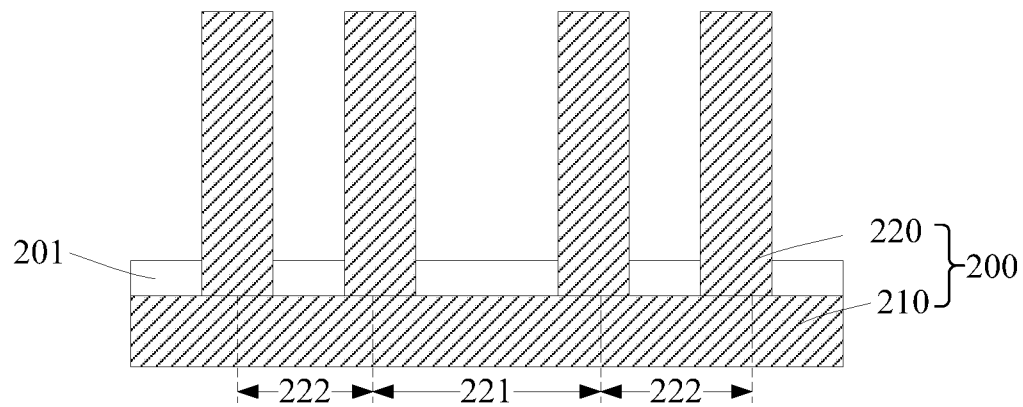

As illustrated in FIG. 9, an isolation layer 201 may be formed on the substrate 210. The isolation layer may cover a portion of sidewalls of the plurality of fins 220.

The isolation layer 201 may be formed by: forming an initial isolation layer (not shown) on the substrate 210 to cover the plurality of fins 220; planarizing the initial isolation layer until exposing top surfaces of the plurality of fins 220; and after planarizing, removing a portion of the initial isolation layer to form the isolation layer 201. A top surface of the isolation layer 201 may be lower than the top surfaces of the plurality of fins 220.

In some other embodiments, the isolation layer 201 may be formed by a spin-on coating (SoC) method, a selective growth method, an atomic layer deposition method, or a patterning method.

In one embodiment, the isolation layer 201 may be made of $SiO_2$. In other embodiment, the isolation layer 201 may be made of a material including $SiN_x$, SiNO, SiC, SiOC, SiCN, SiOCN, SiCBN, or a combination thereof.

Figure 10:
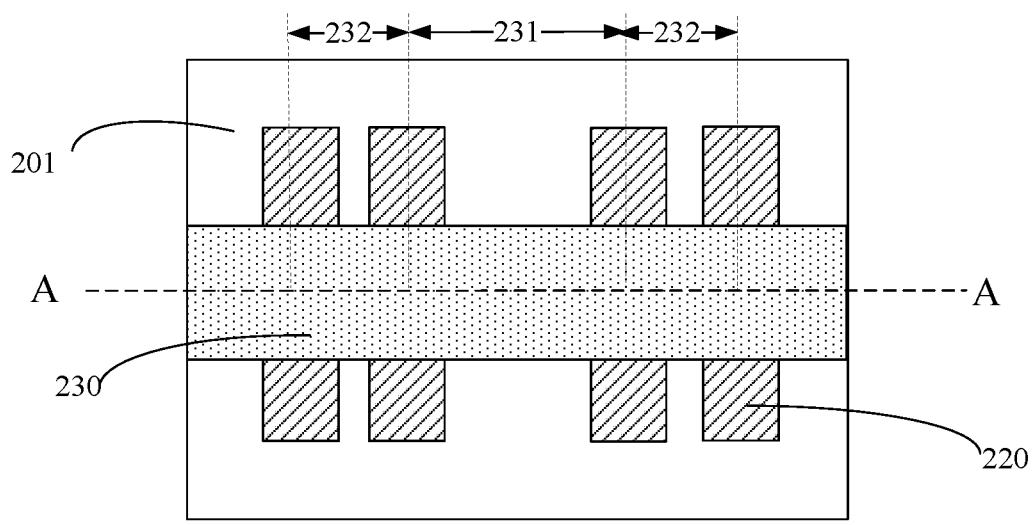
Figure 11:
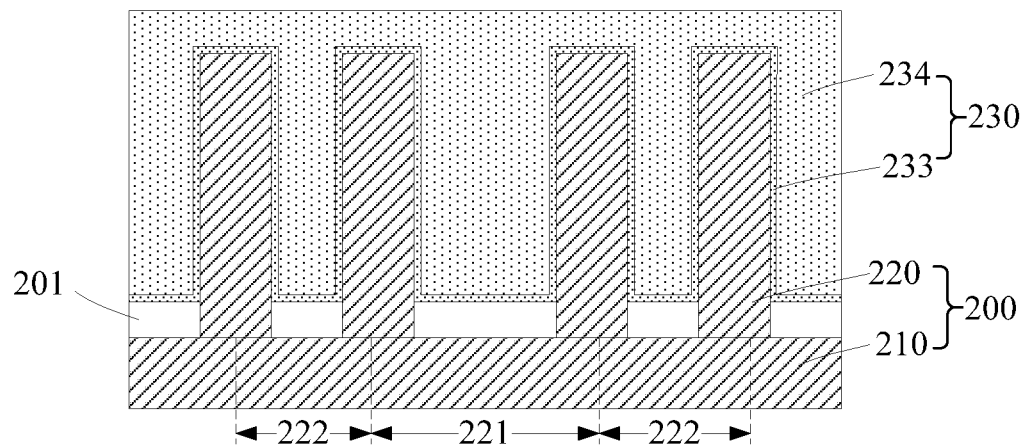

As illustrated in FIG. 10 and FIG. 11, a gate structure 230 may be formed on the substrate 210 (e.g., S104 in FIG. 20). The gate structure 230 may cross the plurality of fins 220. FIG. 10 is a top view of FIG. 11 and FIG. 11 is a cross-sectional view of FIG. 10 along an A-A direction.

In one embodiment, the gate structure 230 may include a first portion in a first region 231 and a second portion in a second region 232. A length of the gate structure in the first region 231 may be larger than a length of the gate structure in the second region 232.

As used herein, the "length of a portion of the dummy gate structure" is a distance of the portion of the gate structure across adjacent fins of the plurality of fins along a direction perpendicular to an extending direction of the plurality of fins. For example, as shown in FIG. 11, the first portion of the dummy gate structure across adjacent fins in the first region 231 has a first length in line with a center-to-center distance of the corresponding adjacent fins in the first region 231 along the direction perpendicular to the extending direction of the plurality of fins. Likewise, the second portion of the dummy gate structure across adjacent fins in the second region 232 has a second length in line with a center-to-center distance of corresponding adjacent fins in the second region 232 along the direction perpendicular to the extending direction of the plurality of fins.

In one embodiment, the first portion of the gate structure 230 in the first region 231 may be disposed between the plurality of fins 220 in the sparse region 221, and the second portion of the gate structure 230 in the second region 232 may be disposed between the plurality of fins 220 in the dense region 222.

In one embodiment, the gate structure 230 may be formed by a gate last process. In other embodiments, the gate structure 230 may be formed by a gate first process.

In one embodiment, the gate structure 230 may include a gate dielectric layer 233 and a gate electrode layer 234 on the gate dielectric layer 233.

The gate dielectric layer 233 may be made of a high-k dielectric material including $Al_2O_3$, $HfO_2$, $ZrO_2$, $TiO_2$, $Ta_2O_5$, or a combination thereof. In other embodiments, the gate dielectric layer 233 may be made of other high-k dielectric materials with a dielectric constant larger than 3.9.

The gate electrode layer 234 may be made of a metal. The metal may include aluminum, copper, titanium, silver, gold, lead, nickel, or a combination thereof. In one embodiment, the gate electrode layer 234 may be made of tungsten.

In one embodiment, the gate structure 230 may further include spacers (not shown here) on surfaces of sidewalls of the gate dielectric layer 234 and the gate dielectric layer 233.

In one embodiment, the spacers may be made of $SiN_x$. In other embodiments, the spacers may be made of a material including $SiO_2$, SiNO, SiC, SiOC, SiCN, SiOCN, SiCBN, or a combination thereof.

Figure 12:
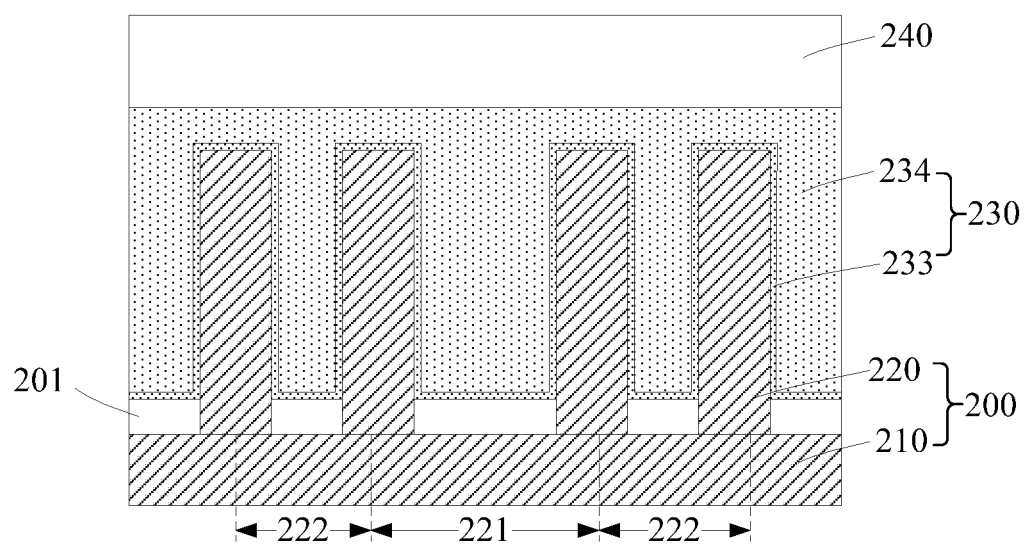

As illustrated in FIG. 12, a sacrificial layer 240 may be formed on the gate structure 230 (e.g., S106 in FIG. 20).

The sacrificial layer 240 may be made of a material including amorphous silicon (a-Si), amorphous carbon (a-C), amorphous germanium (a-Ge), or a combination thereof. In one embodiment, the sacrificial layer 240 may be made of amorphous carbon (a-C).

Amorphous carbon may have a high selective etch ratio with respect to the gate electrode layer 234. Correspondingly, when removing the amorphous carbon, the sacrificial layer 240 may be removed easily to avoid damage on the gate electrode layer 234 (especially on the surface of the gate electrode layer). The process may be simplified and the performance of the formed semiconductor device may be guaranteed.

In one embodiment, the sacrificial layer 240 may be formed by a chemical vapor deposition method. In some other embodiments, the sacrificial layer 240 may be formed by a physical vapor deposition method or an atomic layer deposition method.

In one embodiment, a thickness of the sacrificial layer 240 may be about 10 nm to about 50 nm. When the thickness of the sacrificial layer 240 is less than 10 nm, a height difference between a top surface of a separation section and the top surface of the gate structure may be too small when the sacrificial layer 240 is too thin since the thickness of the sacrificial layer 240 corresponds to the height difference between the top surface of the separation section and the top surface of the gate structure. The separation section cannot effectively split a portion of the gate structure at a side of the separation section and the metal layer at another portion of the gate structure at another side of the separation section, and a short circuit between the portion of the gate structure at the one side of the separation section and the metal layer at the another portion of the gate structure at the another side of the separation section cannot be avoided effectively. When the thickness of the sacrificial layer 240 is larger than 50 nm, the sacrificial layer 240 may be too thick, and the deposition process and removing process of the sacrificial layer 240 may induce cost waste, and the production efficiency may be decreased.

Figure 13:
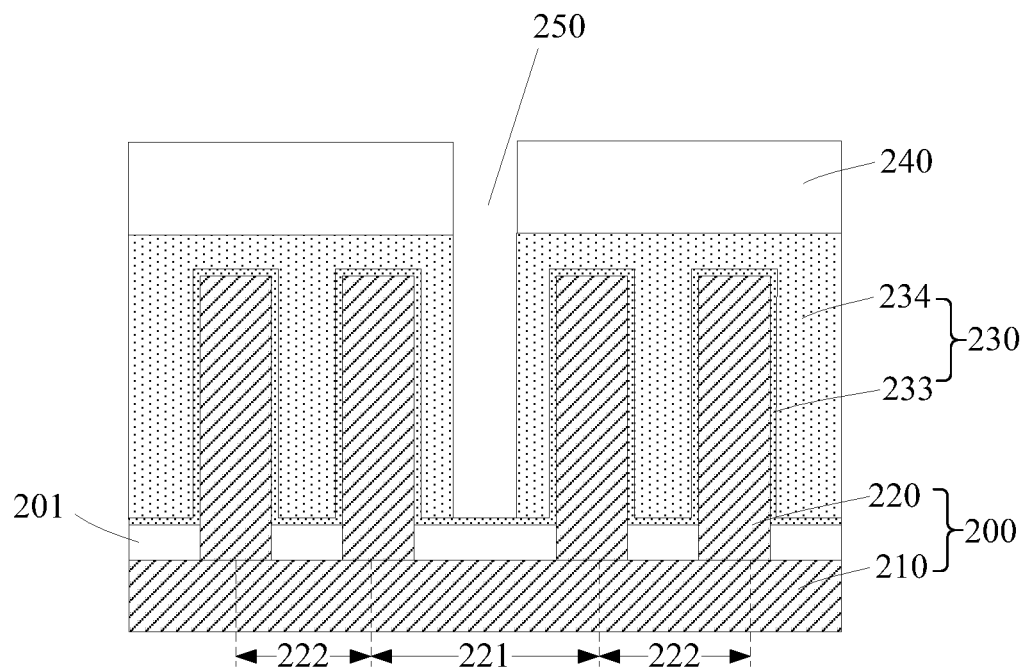

As illustrated in FIG. 13, the sacrificial layer 240 and the first portion of the gate structure 230 in the first region 231 under the sacrificial layer 240 may be etched to expose the surface of the base substrate 200 and form a first opening 250 in the first portion of the gate structure 230 in the first region 231 and the sacrificial layer 240 (e.g., S108 in FIG. 20).

In one embodiment, the sacrificial layer 240 and the gate electrode layer 234 in the first region 231 under the sacrificial layer 240 may be etched to expose the surface of the gate dielectric layer 233 and form a first opening 250 in the first portion of the gate structure 230 in the first region 231 and the sacrificial layer 240. Sidewalls of the first opening 250 may not expose the plurality of fins 220 and the gate dielectric layer 233 on the surfaces of the plurality of fins 220.

In one embodiment, the first opening 250 may be formed by a dry etch process. In some other embodiments, the first opening 250 may be formed by a wet etch process.

Figure 14:
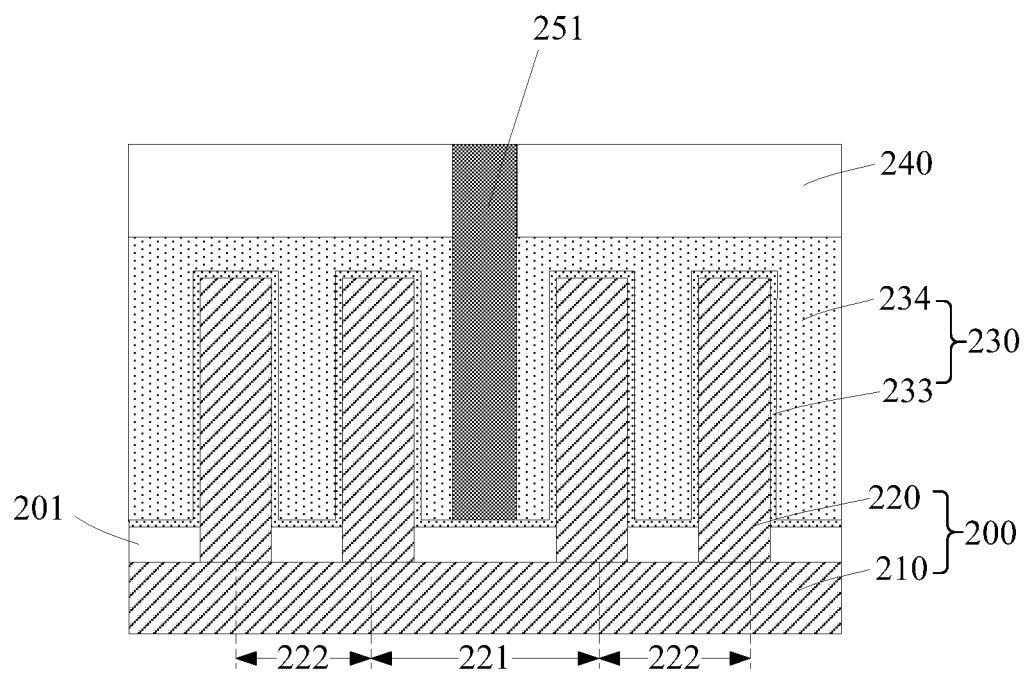

As illustrated in FIG. 14, a separation section 251 may be formed in the first opening 250 and the separation section 251 may fill up the first opening 250 (e.g., S110 in FIG. 20).

In one embodiment, the separation section 251 may be formed by an atomic layer deposition process. In other embodiments, the separation section 251 may be formed by a chemical vapor deposition process.

In one embodiment, the separation section 251 may be formed by: forming a separation layer in the first opening 250 and on the sacrificial layer 240; and planarizing the separation layer until exposing the top surface of the sacrificial layer 240, to form the separation section 251 in the first opening 250.

The separation layer formed by the atomic layer deposition process may have a good coverage gradient, and may fill the first opening with a high quality. The formed separation section 251 may have a good quality correspondingly.

In one embodiment, the separation section 251 may be made of $SiN_x$. In other embodiments, the separation section 251 may be made of an insulating material including $SiO_2$, SiNO, SiC, SiOC, SiCN, SiOCN, SiCBN, or a combination thereof.

Figure 15:
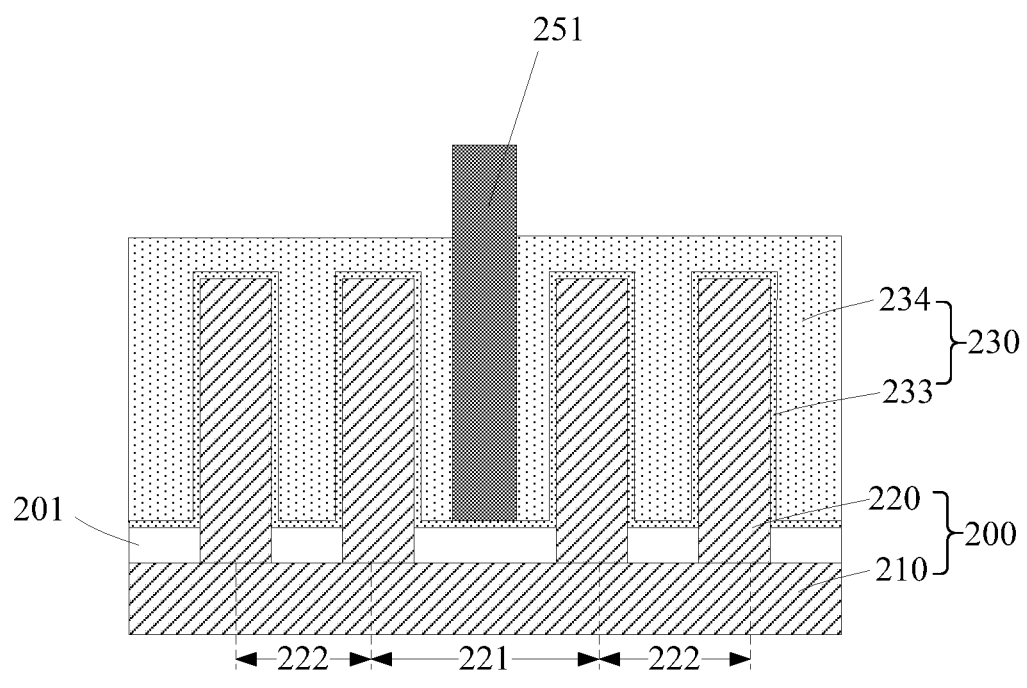

As illustrated in FIG. 15, the sacrificial layer 240 may be removed (e.g., S112 in FIG. 20).

In one embodiment, the sacrificial layer 240 may be removed by a wet etch process. In the wet etch process, the sacrificial layer 240 may have a high etching selection ratio with respect to the gate electrode layer 234. When using the wet etch process to remove the sacrificial layer 240, it may be guaranteed that the residuals of the sacrificial layer 240 can be removed effectively and completely, and also the damage on the gate structure 230 under the sacrificial layer 240 may be avoided. The quality of the gate structure 230 may be improved.

As shown in FIG. 15, after removing the sacrificial layer, the top surface of the separation section 251 may be higher than the top surface of the gate structure 230. Correspondingly, when forming a metal layer on a portion of the gate structure at a side of the separation section 251, the separation section may separate the metal layer from another portion of the gate structure 230 at another side of the separation section 251, and prevent a short circuit between the metal layer and another portion of the gate structure 230 at the another side of the separation section 251.

Figure 16:
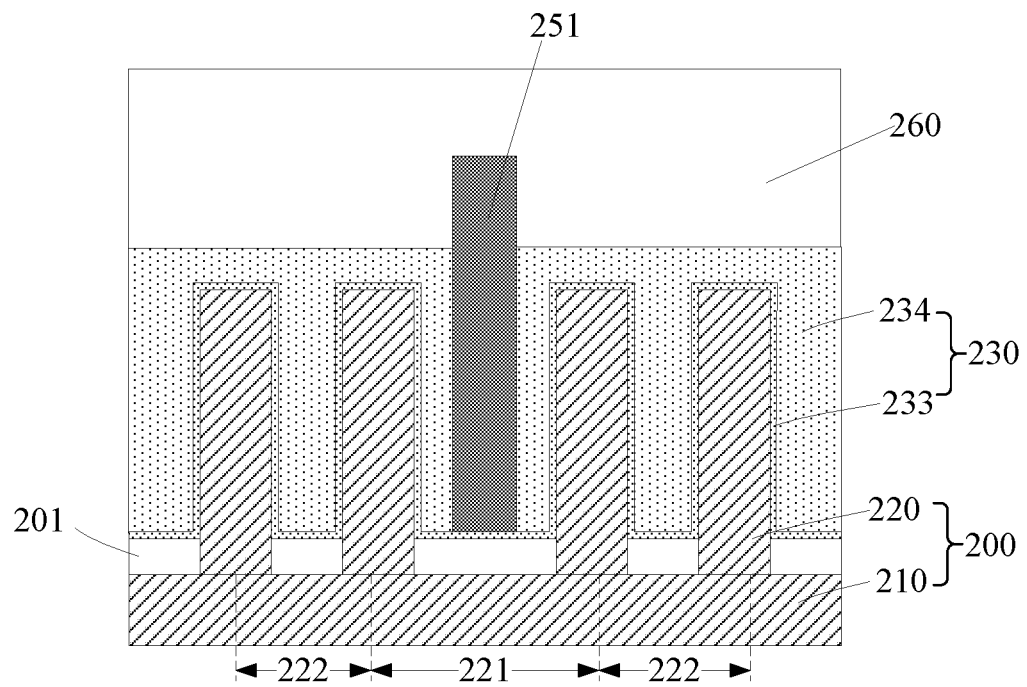

As illustrated in FIG. 16, a dielectric layer 260 may be formed on the top surface of the gate structure 230, and on the top surfaces and a portion of sidewalls of the separation section 251.

In one embodiment, the dielectric layer 260 may be made of $SiN_x$. In other embodiments, the dielectric layer 260 may be made of a dielectric material including Sift, SiNO, SiC, SiOC, SiCN, SiOCN, SiCBN, or a combination thereof.

In one embodiment, the dielectric layer 260 may be formed by: forming an initial dielectric layer on the top surface of the gate structure 230, and on the top surfaces and a portion of sidewalls of the separation section 251; and planarizing the initial dielectric layer to form the dielectric layer 260. The dielectric layer 260 may not expose the top surface of the separation section 251.

Figure 17:
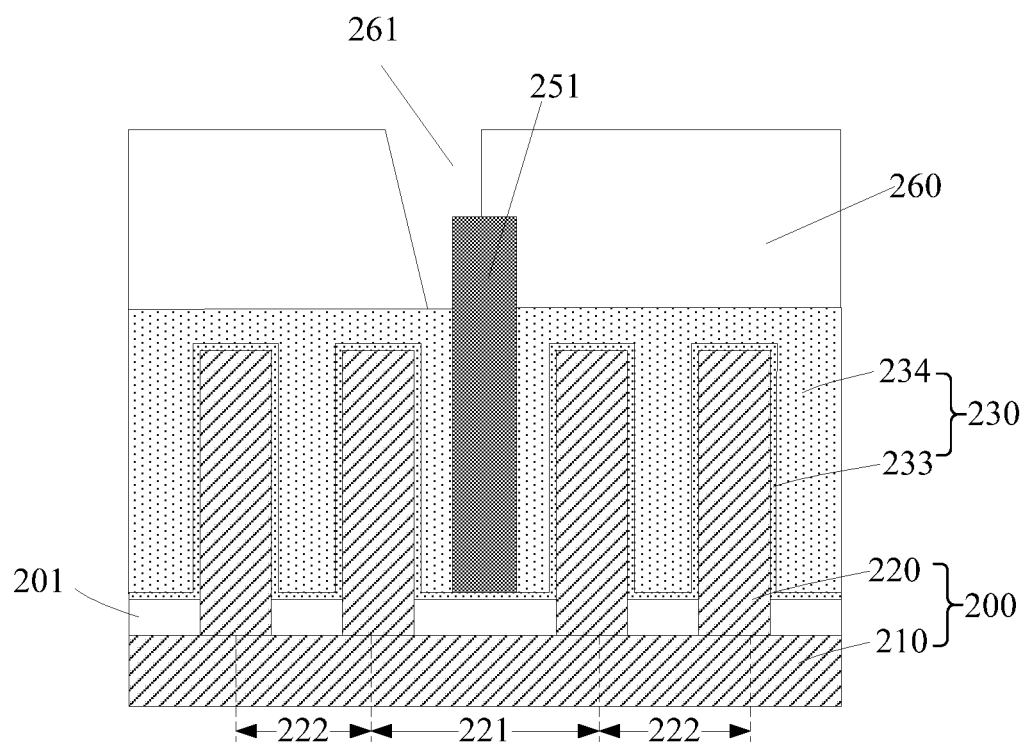

As illustrated in FIG. 17, the dielectric layer 260 may be etched to form a second opening 261 in the dielectric layer 260. A bottom of the second opening 261 may expose the surface of a sidewall of the separation section 251, a portion of the top surface of the separation section 251, a portion of the top surface of the gate structure 230 at the surface of the sidewall of the separation section 251.

In one embodiment, the second opening 261 may provide a space for subsequently forming the metal layer.

In one embodiment, the second opening 261 may be formed by a dry etch process. In other embodiments, the second opening 261 may be formed by a wet etch process.

Figure 18:
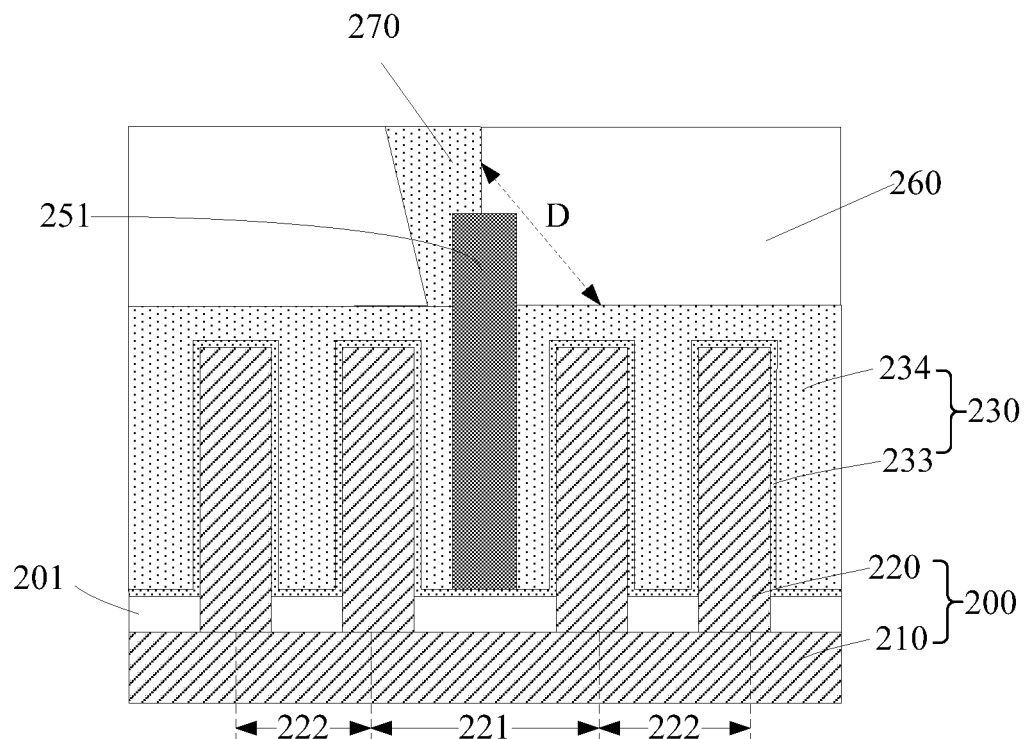

As illustrated in FIG. 18, after forming the second opening 261, a metal layer 270 may be formed in the second opening 261 to fill up the second opening 261.

In one embodiment, the metal layer 270 may be used as a conductive interconnection layer, to achieve an electrically connection with outside world.

In one embodiment, the metal layer 270 may be made of tungsten. In other embodiments, the metal layer 270 may be made of a material including copper, aluminum, titanium, or a combination thereof.

In the present disclosure, the metal layer 270 may be formed on the surface of a sidewall of the separation section 251, a portion of the top surface of the separation section 251, and a portion of the top surface of the gate structure 230 at the surface of the sidewall of the separation section 251. Since the top surface of the separation section 251 may be higher than the top surface of the gate structure 230, a distance D between the metal layer 270 and another portion of the gate structure at another side of the separation section 251 may be increased. A short circuit between the metal layer 270 and another portion of the gate structure at another side of the separation section 251 may be avoided. The performance and quality of the semiconductor device may be improved.

Another embodiment of the present disclosure also provides another fabrication method for a semiconductor device. In the present embodiment, before forming the sacrificial layer, a hard mask layer may be formed on the top surface of the gate structure.

The present embodiment from providing the base substrate to forming the gate structure may be same as the previous embodiments, as illustrated in FIGS. 8-11.

Figure 19:
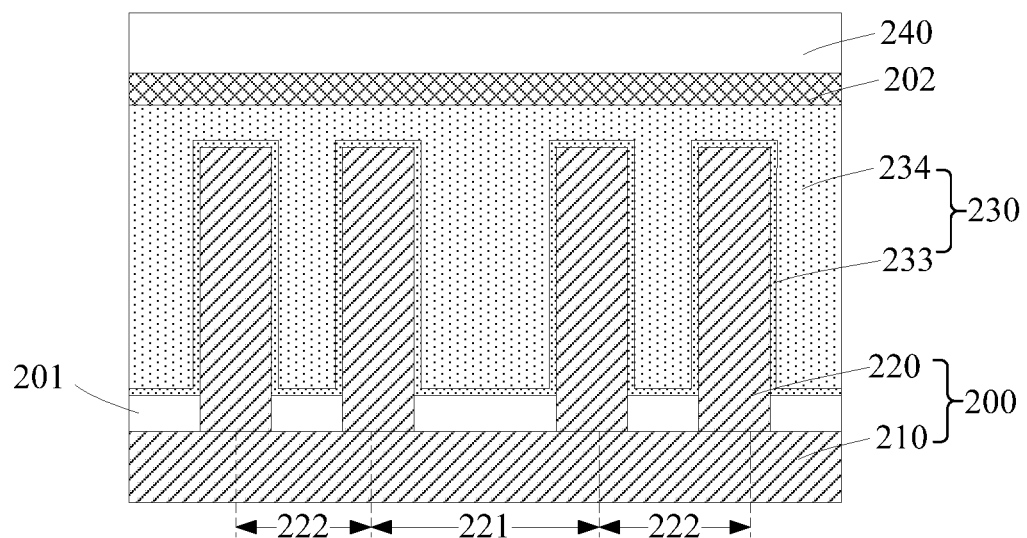
FIG. 19 illustrates semiconductor structures corresponding to certain stages of forming an exemplary semiconductor structure according to various disclosed embodiments of the present disclosure.

As illustrated in FIG. 19, a hard mask layer 202 may be formed on the gate structure 230, and a sacrificial layer 240 may be formed on the hard mask layer 202.

The hard mask layer 202 on the gate structure 230 may be used to prevent a short circuit between the gate structure 230 and source/drain doped layers (not shown), to achieve electrical isolation.

Subsequently, the process after forming the sacrificial layer 240 on the hard mask layer 202 to forming the metal layer 270 may refer to FIG. 13 to FIG. 18.

The present disclosure also provides a semiconductor device. The semiconductor device may include a base substrate 200, a gate structure 230 on the base substrate 200, and a separation section 251. The base substrate 200 may include a substrate 210 and a plurality of fins 220 discrete from each other on n the substrate 210. The plurality of fins 220 may include a sparse region 221 and a dense region 222. The gate structure 230 may include a first portion in a first region 231 and a second portion of a second region 232. A length of the first portion of the gate structure in the first region 231 may be larger than a length of the second portion of the gate structure in the second region 232. The gate structure 230 may be disposed on the substrate 210 and may cross the plurality of fins 220. The first portion of the gate structure 230 in the first region 231 may be disposed between the plurality of fins 220 in the sparse region 221, and the second portion of the gate structure 230 in the second region 232 may be disposed between the plurality of fins 220 in the dense region 222. The separation section 251 may be disposed in the first portion of the gate structure in the first region 231, and may have a top surface higher than a top surface of the gate structure 230.

As used herein, the "length of each portion of the dummy gate structure" is a distance of the portion of the gate structure across adjacent fins of the plurality of fins along a direction perpendicular to an extending direction of the plurality of fins. For example, as shown in FIG. 11, the first portion of the dummy gate structure across adjacent fins in the first region 231 has a first length in line with a center-to-center distance of the corresponding adjacent fins in the first region 231 along the direction perpendicular to the extending direction of the plurality of fins. Likewise, the second portion of the dummy gate structure across adjacent fins in the second region 232 has a second length in line with a center-to-center distance of corresponding adjacent fins in the second region 232 along the direction perpendicular to the extending direction of the plurality of fins.

Since the top surface of the separation section 251 may be higher than the top surface of the gate structure 230, after forming a metal layer on a portion of the gate structure at a side of the separation section 251, the separation section 251 may isolate the metal layer 270 from another portion of the gate structure at another side of the separation section 251. A short circuit between the metal layer 270 and another portion of the gate structure at another side of the separation section 251 may be avoided. The performance and quality of the semiconductor device may be improved.

In one embodiment, a height difference between the top surface of the separation section 251 and the top surface of the gate structure 230 may be about 10 nm to about 50 nm. When the height difference between the top surface of the separation section 251 and the top surface of the gate structure 230 is less than 10 nm, the height difference between the top surface of the separation section 251 and the top surface of the gate structure 230 may be too small. The separation section cannot effectively isolate the metal layer 270 from another portion of the gate structure at another side of the separation section 251. When t the height difference between the top surface of the separation section 251 and the top surface of the gate structure 230 is larger than 50 nm, the height of the separation section 251 may be too large. The material may be wasted, and the production efficiency may be reduced.

In one embodiment, the separation section 251 may be made of $SiN_x$. In other embodiments, the separation section 251 may be made of an insulating material including $SiO_2$, SiNO, SiC, SiOC, SiCN, SiOCN, SiCBN, or a combination thereof.

In one embodiment, the semiconductor device may further include an isolation layer 201 on the substrate 210. The isolation layer may cover a portion of sidewalls of the plurality of fins 220.

In one embodiment, the semiconductor device may further include a dielectric layer. The dielectric layer 260 may be disposed on the top surface of the gate structure 230, on a portion of sidewalls of the separation section 251 higher than the gate structure, and on the top surface of the separation section 251.

In one embodiment, the semiconductor device may further include a hard mask layer 202 on the top surface of the gate structure 230.

The dielectric layer 260 may be disposed on the top surface of the hard mask layer 202, on a portion of sidewalls of the separation section 251 higher than the hard mask layer 202, and on the top surface of the separation section 251.

In one embodiment, the semiconductor device may further include a metal layer 270 in the dielectric layer 260. A bottom surface of the metal layer 270 may be in contact with the top surface of the gate structure 230 at the one side of the separation section 251.

In the present disclosure, the metal layer 270 may be formed on the surface of a sidewall of the separation section 251, a portion of the top surface of the separation section 251, and a portion of the top surface of the gate structure 230 at the surface of the sidewall of the separation section 251. Since the top surface of the separation section 251 may be higher than the top surface of the gate structure 230, a distance D between the metal layer 270 and another portion of the gate structure at another side of the separation section 251 may be increased. A short circuit between the metal layer 270 and another portion of the gate structure at another side of the separation section 251 may be avoided. The performance and quality of the semiconductor device may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
a base substrate, the base substrate including a substrate and a plurality of fins on the substrate, and the plurality of fins including a sparse region and a dense region;
a gate structure disposed on the substrate and crosses the plurality of fins, wherein the gate structure includes a first portion in a first region and a second portion in a second region, a length of the first portion of the gate structure in the first region is larger than a length of the second portion of the gate structure in the second region, the length of the first portion of the gate structure is a distance of the first portion of the gate structure across corresponding adjacent fins of the plurality of fins along a direction perpendicular to an extending direction of the plurality of fins, the length of the second portion of the gate structure is a distance of the second portion of the gate structure across corresponding adjacent fins of the plurality of fins along the direction perpendicular to the extending direction of the plurality of fins, the first portion of the gate structure in the first region is located between the plurality of fins in the sparse region, and the second portion of the gate structure in the second region is located between the plurality of fins in the dense region;

a separation section in the first portion of the gate structure in the first region, wherein a top surface of the separation section is higher than a top surface of the gate structure, and a width of the entire separation section along the direction perpendicular to the extending direction of the plurality of fins is uniform;

a dielectric layer on the top surface of the gate structure, on sidewalls of the separation section that are higher than the gate structure, and on the top surface of the separation section; and a metal layer in the dielectric layer, a first bottom surface of the metal layer being in contact with the top surface of the gate structure at a side of the separation section, and a second bottom surface of the metal layer being in contact with the top surface of the separation section.

2. The device according to claim 1, wherein:
the top surface of the separation section is higher than the top surface of the gate structure by about 10 nm to about 50 nm.

3. The device according to claim 1, wherein:
the separation section is made of a material including $SiN_x$, $SiO_2$, SiON, or a combination thereof.

4. The device according to claim 1, further including an isolation layer on the substrate, wherein:
the isolation layer covers a portion of sidewalls of the plurality of fins.

5. The device according to claim 1, further including a hard mask layer on the top surface of the gate structure, wherein the dielectric layer is located on a top surface of the hard mask layer, on the sidewalls of the separation section that are higher than the hard mask layer, and on the top surface of the separation section.

6. The device according to claim 1, wherein:
the gate structure includes:
a gate dielectric layer on a top surface of the substrate and top and sidewall surfaces of the plurality of fins; and
a gate electrode layer on the gate dielectric layer and across the plurality of fins; and
the separation section is formed on a top surface of the gate dielectric layer in the first region, and the top surface of the separation section is higher than a top surface of the gate electrode layer.

7. The device according to claim 1, wherein:
a contact area between the second bottom surface of the metal layer and the top surface of the separation section is smaller than an area of the top surface of the separation section.

8. A fabrication method of a semiconductor device, comprising:
providing a base substrate, the base substrate including a substrate and a plurality of fins on the substrate, and the plurality of fins including a sparse region and a dense region;

forming a gate structure disposed on the substrate and crosses the plurality of fins, wherein the gate structure includes a first portion in a first region and a second portion in a second region, a length of the first portion of the gate structure in the first region is larger than a length of the second portion of the gate structure in the second region, the length of the first portion of the gate structure is a distance of the first portion of the gate structure across corresponding adjacent fins of the plurality of fins along a direction perpendicular to an extending direction of the plurality of fins, the length of the second portion of the gate structure is a distance of the second portion of the gate structure across corresponding adjacent fins of the plurality of fins along the direction perpendicular to the extending direction of the plurality of fins, the first portion of the gate structure in the first region is located between the plurality of fins in the sparse region, and the second portion of the gate structure in the second region is located between the plurality of fins in the dense region;

forming a sacrificial layer on the gate structure;
etching the sacrificial layer and the first portion of the gate structure in the first region under the sacrificial layer until exposing a surface of the base substrate, thereby forming a first opening in the first portion of the gate structure in the first region and in the sacrificial layer;
forming a separation section in the first opening to fill up the first opening, wherein a top surface of the separation section is higher than a top surface of the gate structure, and a width of the entire separation section along the direction perpendicular to the extending direction of the plurality of fins is uniform;
removing the sacrificial layer;
forming a dielectric layer on the top surface of the gate structure, on a portion of sidewalls of the separation section, and on the top surface of the separation section; and
forming a metal layer in the dielectric layer, a first bottom surface of the metal layer being in contact with the top surface of the gate structure at a side of the separation section, and a second bottom surface of the metal layer being in contact with the top surface of the separation section.

9. The method according to claim 8, wherein:
the sacrificial layer is made of a material including amorphous silicon, amorphous carbon, amorphous germanium, or a combination thereof.

10. The method according to claim 8, wherein:
a thickness of the sacrificial layer is about 10 nm to about 50 nm.

11. The method according to claim 8, wherein:
the separation section is formed by an atomic layer deposition process or a chemical vapor deposition process.

12. The method according to claim 8, wherein:
the separation section is made of a material including $SiN_x$, $SiO_2$, SiNO, or a combination thereof.

13. The method according to claim 8, after forming the plurality of fins and before forming the gate structure, further including:
forming an isolation layer on the substrate to cover a portion of sidewalls of the plurality of fins.

14. The method according to claim 8, before forming the sacrificial layer, further including:
forming a hard mask layer on the top surface of the gate structure.

15. The method according to claim 8, after forming the dielectric layer, further including:
    etching the dielectric layer to form a second opening in the dielectric layer, wherein a bottom of the second opening exposes a sidewall surface of a side of the separation section, a portion of the top surface of the separation section, and a portion of the top surface of the gate structure at the sidewall surface of the one side of the separation section.

* * * * *